(12) United States Patent
Yoshikawa

(10) Patent No.: US 12,191,407 B2
(45) Date of Patent: Jan. 7, 2025

(54) CRYSTAL SILICON SOLAR CELL MODULE AND CELL AGGREGATE FOR CRYSTAL SILICON SOLAR CELL MODULE

(71) Applicant: KANEKA CORPORATION, Osaka (JP)

(72) Inventor: Kunta Yoshikawa, Settu (JP)

(73) Assignee: KANEKA CORPORATION, Osaka (JP)

( * ) Notice: Subject to any disclaimer, the term of this patent is extended or adjusted under 35 U.S.C. 154(b) by 505 days.

(21) Appl. No.: 17/605,983

(22) PCT Filed: Apr. 10, 2020

(86) PCT No.: PCT/JP2020/016065
§ 371 (c)(1),
(2) Date: Oct. 22, 2021

(87) PCT Pub. No.: WO2020/218026
PCT Pub. Date: Oct. 29, 2020

(65) Prior Publication Data
US 2022/0209032 A1 Jun. 30, 2022

(30) Foreign Application Priority Data

Apr. 23, 2019 (JP) ................................. 2019-081587

(51) Int. Cl.
*H01L 31/0224* (2006.01)
*H01L 31/05* (2014.01)
*H01L 31/068* (2012.01)

(52) U.S. Cl.
CPC .. *H01L 31/022441* (2013.01); *H01L 31/0516* (2013.01); *H01L 31/0682* (2013.01)

(58) Field of Classification Search
CPC ......... H01L 31/022441; H01L 31/0516; H01L 31/0682
See application file for complete search history.

(56) References Cited

U.S. PATENT DOCUMENTS

2014/0366928 A1* 12/2014 Niinobe .......... H01L 31/022441
136/246
2019/0081185 A1 3/2019 Lee et al.
(Continued)

FOREIGN PATENT DOCUMENTS

CN 106129162 A 11/2016
CN 106531829 A 3/2017
(Continued)

OTHER PUBLICATIONS

English Machine Translation for CN 208570638U (Year: 2019).*
(Continued)

*Primary Examiner* — Kourtney R S Carlson
(74) *Attorney, Agent, or Firm* — Studebaker & Brackett PC

(57) ABSTRACT

Each solar cell 1 includes: a silicon substrate 2; a diffusion layer 3; a first collection electrode 4 contacting the diffusion layer 3; a first connection electrode 5 contacting the diffusion layer 3 and the first collection electrode 4; an insulation layer 7 having an opening portion extending therethrough; a second collection electrode 8 contacting the insulation layer 7 and connected to the single crystal silicon substrate 2 via the opening portion 70; and a second connection electrode 9 contacting the second collection electrode 8. The first connection electrode 5 and the second connection electrode 9 are separated from each other. The second collection electrode 8 and the single crystal silicon substrate 2 are separated from each other via the insulation layer 7 in almost all or all of an overlapping area of each two adjacent PERC solar cells 1.

5 Claims, 10 Drawing Sheets

(56) References Cited

U.S. PATENT DOCUMENTS

2019/0097073 A1    3/2019   Oh et al.
2019/0355859 A1   11/2019   Zheng et al.
2020/0185548 A1    6/2020   Konno et al.

FOREIGN PATENT DOCUMENTS

| | | | | |
|---|---|---|---|---|
| CN | 108987509 A | * | 12/2018 | ........... H01L 31/043 |
| CN | 208570638 U | * | 3/2019 | ........... H01L 31/043 |
| CN | 208706668 U | | 4/2019 | |
| JP | 2004-006565 A | | 1/2004 | |
| JP | 2017-517145 A | | 6/2017 | |
| JP | 2019-050375 A | | 3/2019 | |
| WO | WO-2009071561 A2 | * | 6/2009 | ....... H01L 31/02245 |
| WO | 2018/037746 A1 | | 3/2018 | |
| WO | 2018/142544 A1 | | 8/2018 | |
| WO | 2018/173125 A1 | | 9/2018 | |

OTHER PUBLICATIONS

International Search Report issued in PCT/JP2020/016065; mailed Jun. 23, 2020.

Notification of Transmittal of Translation of the International Preliminary Report on Patentability and Translation of Written Opinion of the International Searching Authority; PCT/JP2020/016065; mailed Nov. 4, 2021.

An Office Action mailed by China National Intellectual Property Administration on Jul. 12, 2023, which corresponds to Chinese Patent Application No 202080030736.7 and is related to U.S. Appl. No. 17/605,983; with English translation.

An Office Action; "Notice of Reasons for Refusal," mailed by the Japanese Patent Office on Mar. 15, 2024, which corresponds to Japanese Patent Application No. 2021-515980 and is related to U.S. Appl. No. 17/605,983; with English language translation.

* cited by examiner

CRYSTAL SILICON SOLAR CELL MODULE AND CELL AGGREGATE FOR CRYSTAL SILICON SOLAR CELL MODULE

CROSS-REFERENCE TO RELATED APPLICATION

This application claims priority to Japanese Patent Application No. 2019-081587, the disclosure of which is incorporated herein by reference in its entirety.

FIELD

The present invention relates to a crystal silicon solar cell module including a solar cell string formed of a plurality of solar cells interconnected with each other by shingling, and a cell aggregate for the crystal silicon solar cell module.

BACKGROUND

Conventionally, crystal silicon solar cell modules with various different structures have been proposed. Examples of such a crystal silicon solar cell module include a solar module including a solar string (Patent Literature 1). In this solar module, a plurality of solar cells having a strip shape are aligned in such a manner that each two adjacent solar cells have their adjacent long sides overlapping each other, for example so as to shingle roof boards, and these solar cells in this state have their overlapping end portions connected to each other to form the solar cell string. Further, in this solar module, the solar cells are arranged to overlap each other to eliminate a gap between each two adjacent solar cells. This configuration increases the charging rate of the solar cells in the solar module to enable an increased module efficiency.

Examples of the solar cell forming the crystal silicon solar cell module includes a PERC (Passivated Emitter and Rear Cell) solar cell (Patent Literature 2). This solar cell includes: a p-type silicon substrate; an n-type impurity diffusion area and a light receiving surface electrode that are sequentially laminated on a light receiving surface side of the silicon substrate; and a rear surface passivation film and a rear surface electrode that are sequentially laminated on a rear surface side of the silicon substrate. The rear surface passivation film has a plurality of opening portions provided therein. In such a solar cell, the rear surface passivation film terminates the dangling bonds of the silicon atoms in a surface part of the rear surface of the silicon substrate. In this solar cell, therefore, occurrence of recombination is suppressed. The position at which these solar cells are connected to each other is not particularly limited.

CITATION LIST

Patent Literature

Patent Literature 1: JP 2017-517145 T
Patent Literature 2: JP 2004-006565 A

SUMMARY

Technical Problem

No sufficient consideration has been made for a structure in which the aforementioned PERC solar cells apply to the solar module having the solar cells arranged to overlap each other as aforementioned, that is, the solar module formed by shingling connection. Therefore, no optimal structure thereof has been provided.

It is therefore an object of the present invention to provide a crystal silicon solar cell module including a plurality of PERC solar cells interconnected with each other by shingling, the crystal silicon solar cell module with an optimized structure, and a cell aggregate for the crystal silicon solar cell module.

Solution to Problem

A crystal silicon solar cell module of the present invention includes: a solar cell string including a plurality of PERC solar cells, each two adjacent ones of the plurality of PERC solar cells being interconnected with each other by shingling; each of the plurality of PERC solar cells including: a single crystal silicon substrate of one conductivity type having a first major surface and a second major surface; a diffusion layer of reverse conductivity type that is in contact with the first major surface; a first collection electrode that is in contact with the diffusion layer on a side opposite to a side on which the diffusion layer is in contact with the single crystal silicon substrate; a first connection electrode that is in contact with the diffusion layer and the first collection electrode; an insulation layer that is in contact with the second major surface and has at least one opening portion extending therethrough; a second collection electrode that is in contact with the insulation layer on a side opposite to a side on which the insulation layer is in contact with the single crystal silicon substrate, and that is connected to the single crystal silicon substrate via the at least one opening portion; and a second connection electrode that is in contact with the second collection electrode on a side opposite to a side on which the second collection electrode is in contact with the insulation layer, in which the first connection electrode and the second connection electrode are separated from each other when viewed from a direction substantially perpendicular to the first major surface in the each of the plurality of PERC solar cells, the solar cell string has an overlapping area in which the each two adjacent solar cells overlap each other, in the overlapping area of the each two adjacent solar cells, the first connection electrode of one of the each two adjacent solar cells and the second connection electrode of the other of the each two adjacent solar cells are connected with each other while overlapping each other when viewed from the direction substantially perpendicular to the first major surface, and the second collection electrode and the single crystal silicon substrate are separated from each other via the insulation layer in almost all of the overlapping area excluding a part thereof or all of the overlapping area.

In the crystal silicon solar cell module, the configuration can be such that the second collection electrode of each of the plurality of solar cells is arranged at least between the second connection electrode and an end edge of the single crystal silicon substrate located on one side, on which side the second connection electrode is arranged in an aligning direction of the plurality of solar cells in the solar cell string.

In the crystal silicon solar cell module, the configuration can be such that the second connection electrode and the single crystal silicon substrate are separated from each other via the insulation layer.

In the crystal silicon solar cell module, the configuration can be such that the first major surface is a light receiving surface.

In the crystal silicon solar cell module, the configuration can be such that, in each of the plurality of solar cells, an end edge of the single crystal silicon substrate located on one side, on which side the second connection electrode is arranged in the aligning direction of the solar cells in the solar cell string, has a surface substantially perpendicular to the first major surface, and an inclined surface formed by laser irradiation when the each of the plurality of solar cells is formed, and a distance between an end edge on the one side of the second collection electrode and the surface of the single crystal silicon substrate substantially perpendicular to the first major surface is 150% or more of a width in the aligning direction of the inclined surface.

In the crystal silicon solar cell module, the configuration can be such that, in each of the plurality of solar cells, a distance between an end edge of the second collection electrode located on an other side, on which side the first connection electrode is arranged in an aligning direction of the plurality of solar cells in the solar cell string, and an end edge on the other side of the single crystal silicon substrate is 40% or more and 90% or less of a dimension in the aligning direction of the overlapping area.

In the crystal silicon solar cell module, the configuration can be such that, in each of the plurality of solar cells, a distance between an end edge of the second collection electrode located on an other side, on which side the first connection electrode is arranged in the aligning direction of the plurality of solar cells in the solar cell string, and an end edge on the other side of the single crystal silicon substrate is 0.4 mm or more.

In the crystal silicon solar cell module, the configuration can be such that the second connection electrode includes second connection electrodes arranged at an interval from each other in a direction substantially orthogonal to both an aligning direction of the plurality of solar cells in the solar cell string and a thickness direction of the single crystal silicon substrate, and the insulation layer has an opening portion arranged in an area serving as the interval between the second connection electrodes.

A cell aggregate for a crystal silicon solar cell module of the present invention is composed of an aggregate of a plurality of small segments respectively forming a plurality of PERC solar cells when the aggregate is separated into pieces, the cell aggregate having one side and an opposed side to the one side, the plurality of small segments respectively defined by defining lines that are straight lines substantially parallel to the one side of the cell aggregate, in which each of the plurality of small segments includes: a single crystal silicon substrate of one conductivity type having a first major surface and a second major surface; a diffusion layer of reverse conductivity type that is in contact with the first major surface; a first collection electrode that is in contact with the diffusion layer on a side opposite to a side on which the diffusion layer is in contact with the single crystal silicon substrate; a first connection electrode that is in contact with the diffusion layer and the first collection electrode; an insulation layer that is in contact with the second major surface and has at least one opening portion extending therethrough; a second collection electrode that is in contact with the insulation layer on a side opposite to a side on which the insulation layer is in contact with the single crystal silicon substrate, and that is connected to the single crystal silicon substrate via the at least one opening portion; and a second connection electrode that is in contact with the second collection electrode on a side opposite to a side on which the second collection electrode is in contact with the insulation layer, the first connection electrode and the second connection electrode are separated from each other when viewed from a direction substantially perpendicular to the first major surface in the each of the plurality of small segments, the second collection electrode is separated from the one side of the cell aggregate and separated from the opposed side to the one side of the cell aggregate, when viewed from a direction substantially perpendicular to the second major surface, in a small segment including the one side of the cell aggregate among the plurality of small segments, the second connection electrode is provided along the defining line away from the one side of the cell aggregate, and in a small segment including the other side of the cell aggregate among the plurality of small segments, the second connection electrode is provided along the defining line away from the opposed side of the cell aggregate.

DESCRIPTION OF EMBODIMENTS

Figure 1:
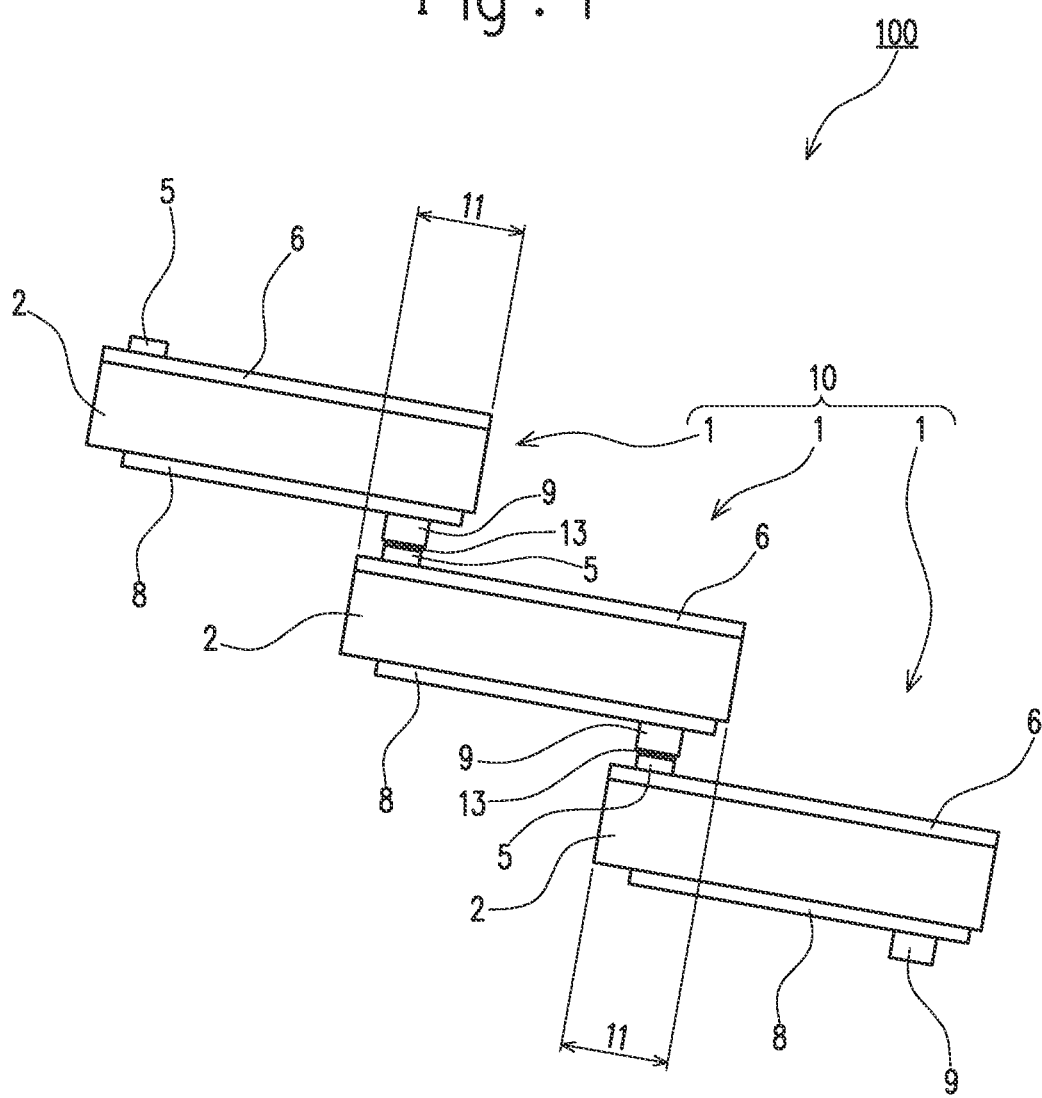
FIG. 1 is a side view of a crystal silicon solar cell module according to an embodiment.

One embodiment of the present invention will be hereinafter described with reference to the drawings. The term "solar cell" herein refers to an individual plate-shaped portion forming a "solar cell string". The drawings schematically show the configuration of this embodiment, and thus differ from design drawings. Thus, some of the dimensions in the drawings are not necessary accurate.

As shown in FIG. 1, a crystal silicon solar cell module 100 of this embodiment includes a solar cell string 10 including a plurality of solar cells 1, each two adjacent ones of the plurality of solar cells 1 being interconnected with each other by shingling. Among the each two adjacent solar cells 1, one solar cell 1 has one end portion in an aligning direction of the solar cells 1 while the other solar cell has the other end portion in the aligning direction of the solar cells 1, and the one end portion and the other end portion overlap each other to thereby form the solar cell string 10.

Figure 2:
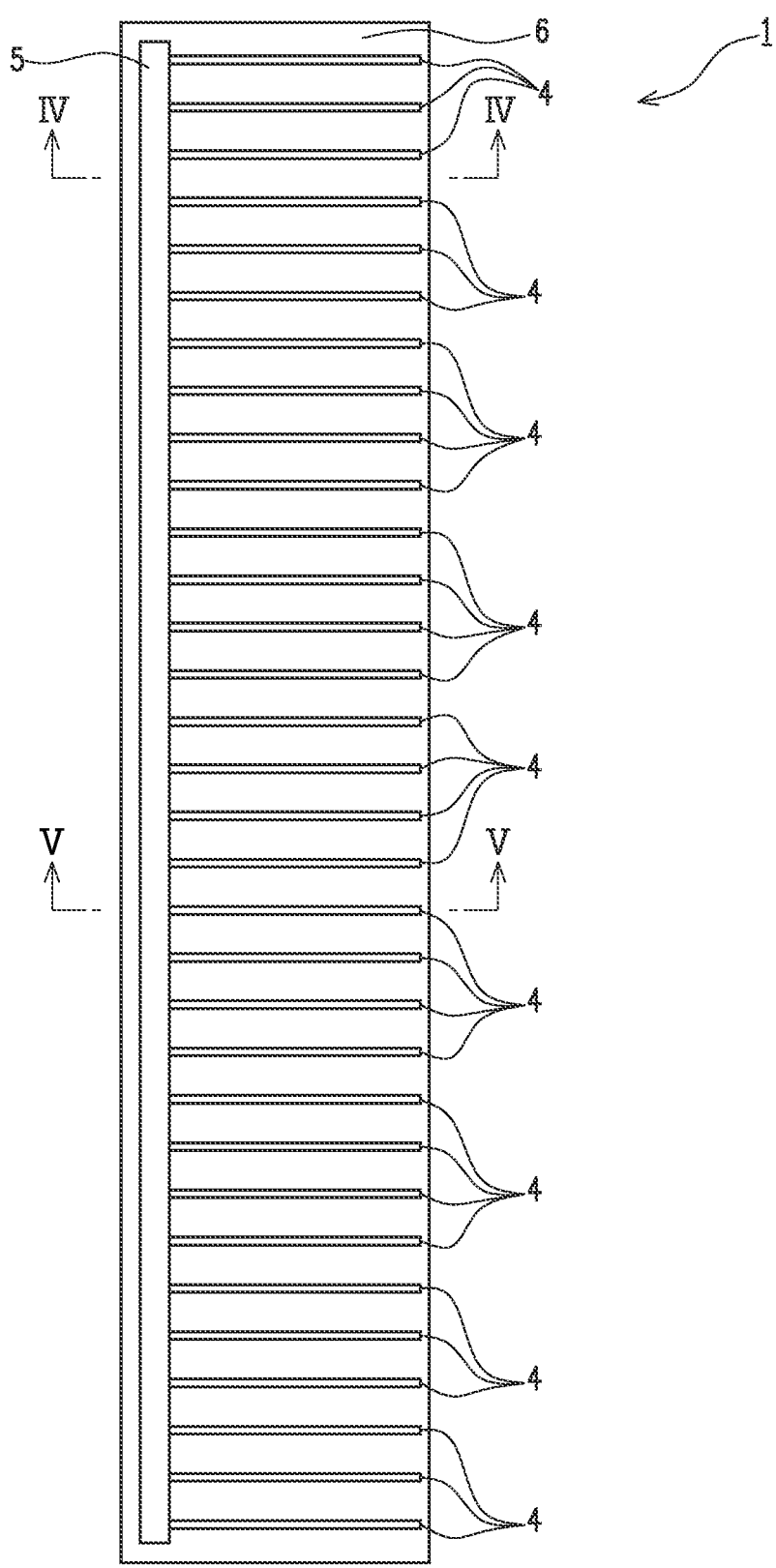
FIG. 2 is a plan view of a solar cell forming the crystal silicon solar cell module.
Figure 3:
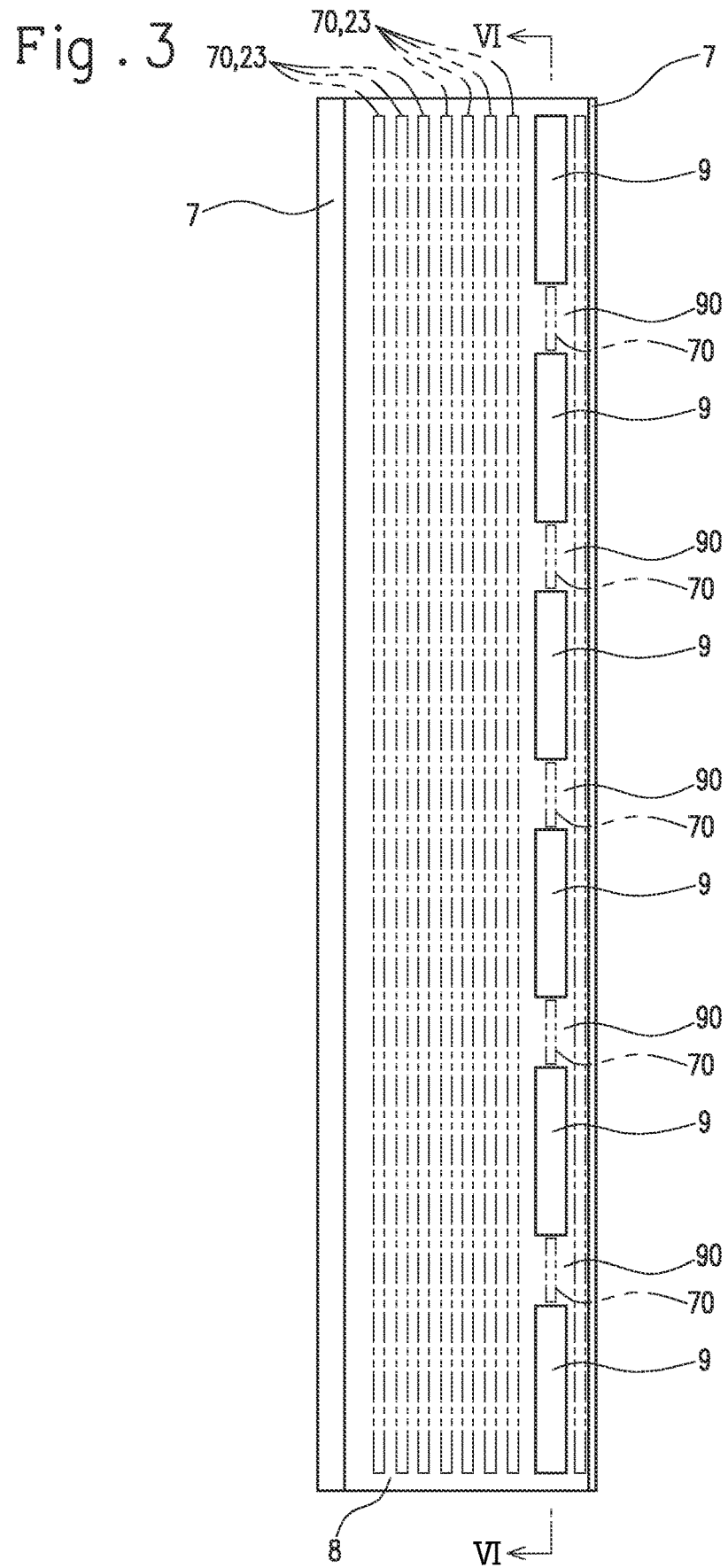
FIG. 3 is a bottom view of the solar cell.
Figure 4:
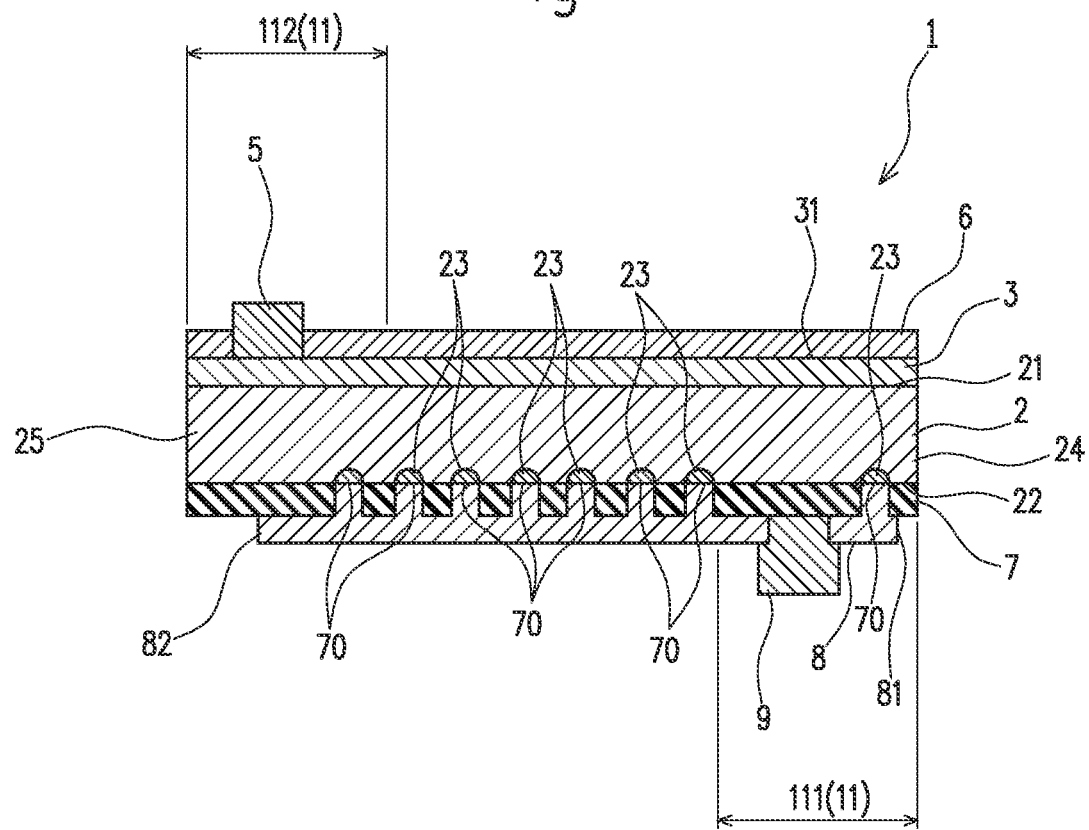
FIG. 4 is a cross-sectional view taken along line IV-IV in FIG. 2.
Figure 5:
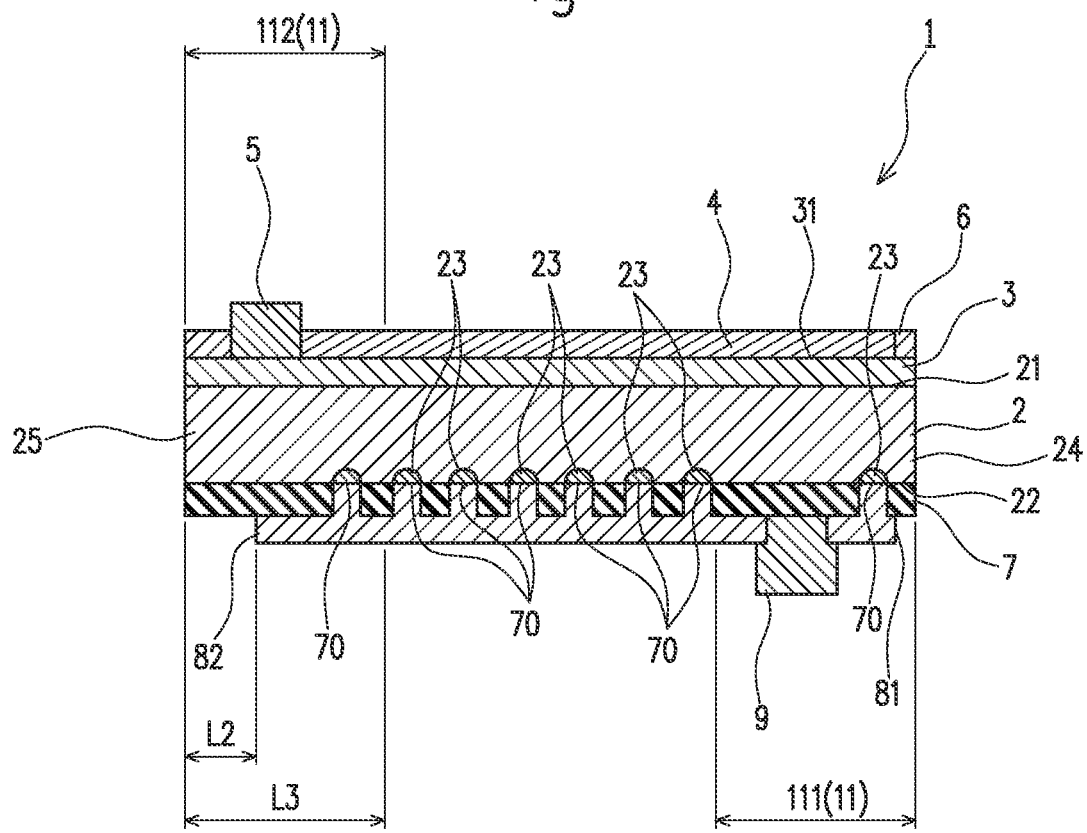
FIG. 5 is a cross-sectional view taken along line V-V in FIG. 2.
Figure 7:
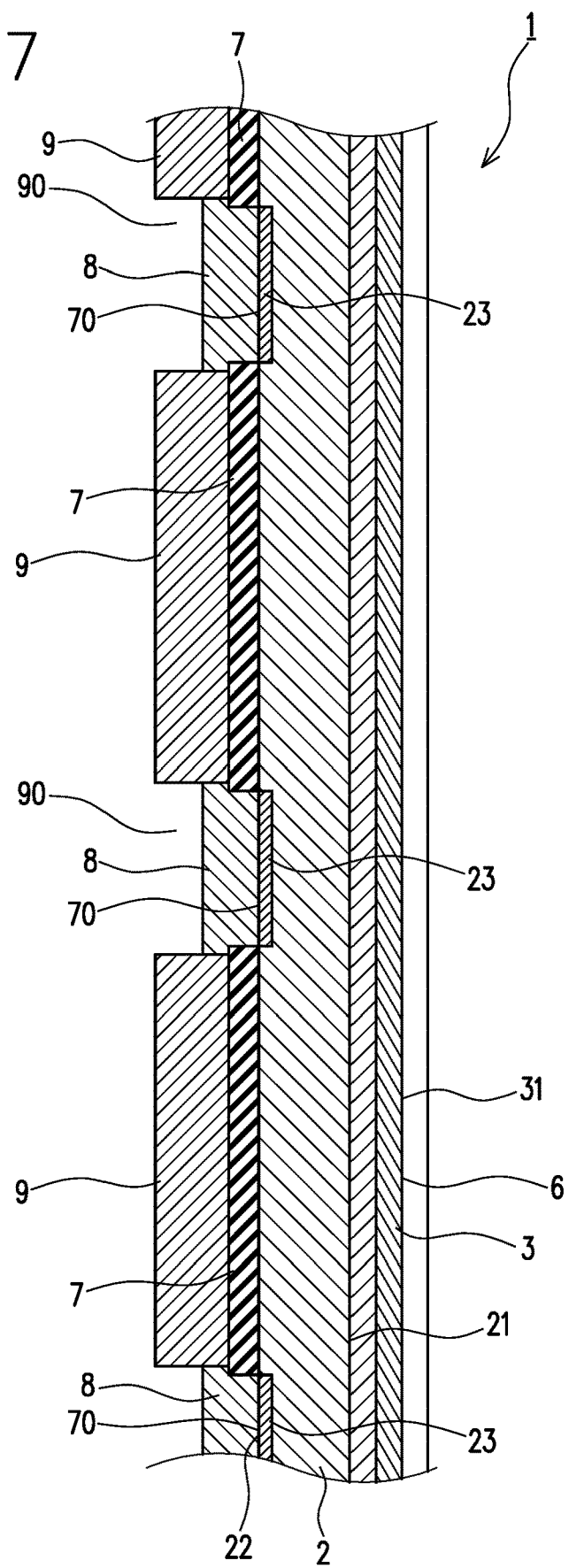
FIG. 7 is a cross-sectional view taken along line VI-VI in FIG. 3.

Each of the plurality of solar cells 1 is a PERC type, and as shown in FIG. 2 and FIG. 3, has a strip shape (a substantially rectangular shape) when viewed from a direction substantially perpendicular to a major surface thereof. The dimension in a width direction of the solar cell 1 is, for example, about 25 mm. As shown in FIG. 4 and FIG. 5, the solar cell 1 includes: a single crystal silicon substrate 2 of one conductivity type having a first major surface 21 and a second major surface 22; and a diffusion layer 3 of reverse conductivity type, a first collection electrode 4 (see FIG. 5), and a first connection electrode 5, which are provided on a side of the first major surface 21. As shown in FIG. 7, the solar cell 1 further includes a first insulation layer 6 provided on a side of the first major surface 21. Further, the solar cell 1 includes a second insulation layer (insulation layer) 7, a second collection electrode 8, and a second connection electrode 9, which are provided on a side of the second major surface 22. The solar cell 1 is, for example, a solar cell of one-surface light reception type.

In the solar cell 1, the first connection electrode 5 and the second connection electrode 9, which are provided on the same single crystal silicon substrate 2, are separated from each other when viewed from a direction substantially perpendicular to the first major surface 21 of the single crystal silicon substrate 2 (see FIG. 1). The solar cell string 10 includes an overlapping area 11 in which each two adjacent solar cells 1 overlap each other. In the overlapping area 11, the first connection electrode 5 of one solar cell 1 out of the each two adjacent solar cells 1 and the second connection electrode 9 of the other solar cell 1 out of the each two adjacent solar cells 1 are connected to each other while overlapping each other (i.e., connected to each other by shingling), when viewed from the direction substantially perpendicular to the first major surface 21. The overlapping area 11 includes: a first overlapping area 111 located on one side of the solar cell 1, which corresponds to the side on which the second connection electrode 9 is arranged, in the aligning direction of the solar cells 1; and a second overlapping area 112 located on the other side of the solar cell 1, which corresponds to the side on which the first connection electrode 5 is arranged, in the aligning direction of the solar cells 1 (see FIG. 4 and FIG. 5).

The conductivity type (one conductivity type) of the single crystal silicon substrate 2 can be an n-type or a p-type, and for example is a p-type in which the substrate is doped with boron at a concentration of about $1e15/cm^3$. The first major surface 21 of the single crystal silicon substrate 2 serves as a single light receiving surface in the case where the solar cell 1 is of one-surface light reception type. The second major surface 22 of the single crystal silicon substrate 2 is provided with at least one base portion 23. The base portion 23 is formed at a portion of the substrate that contacts the second collection electrode 8, is of the same conductivity type as that of the substrate, and is doped at a higher concentration than that of the substrate to thereby efficiently collect majority carriers. That is, the base portion 23 is, for example, a p++ portion in which boron is diffused to a concentration of about $1e18/cm^3$. The base portion 23 has a shape conforming to the shape of an opening portion of the second insulation layer 7, which will be described later, and for example has a line shape extending in a direction substantially orthogonal to both the aligning direction of the solar cells 1 and a thickness direction of the single crystal silicon substrate 2.

Figure 6:
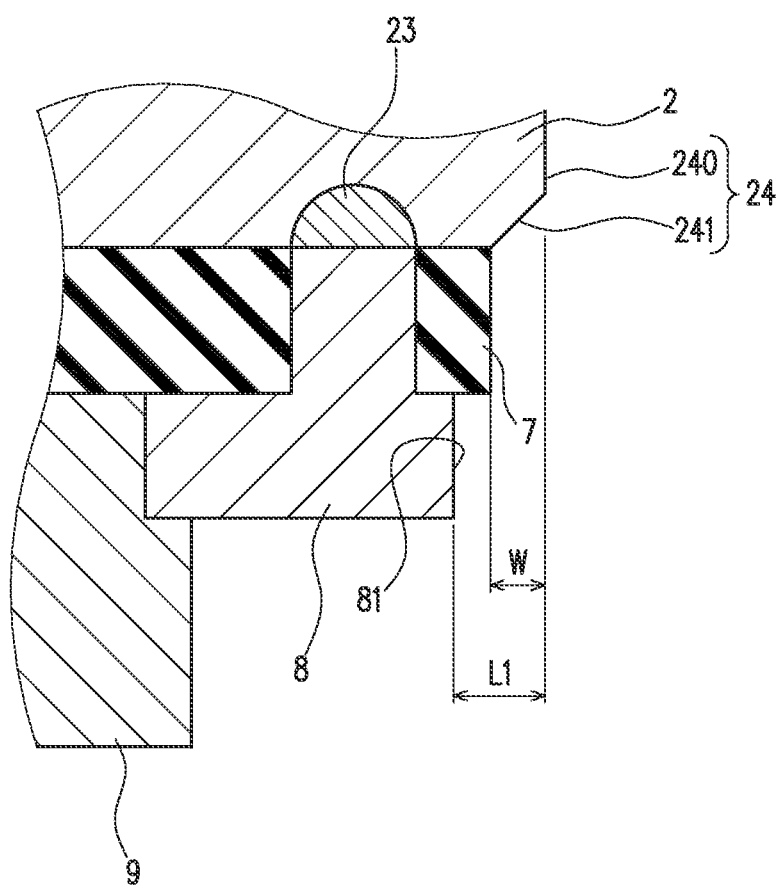
FIG. 6 is an enlarged view of a portion near a second connection electrode of the solar cell in FIG. 5.

One end edge 24 (i.e., end edge located on the one side, on which side the second connection electrode 9 is arranged, in the aligning direction of the solar cells 1) of the single crystal silicon substrate 2 of this embodiment has: a perpendicular surface (cleavage surface) 240 substantially perpendicular to the first major surface 21; and an inclined surface 241, which is a trace of laser formed by laser irradiation when the solar cell 1 is formed (see FIG. 6). The one end edge 24 of the single crystal silicon substrate 2 and an other end edge 25 of the single crystal silicon substrate 2 (i.e., end edge located on the other side, on which side the first connection electrode 5 is arranged, in the aligning direction) are illustrated as a perpendicular surface in FIG. 4 and FIG. 5, but actually have such shapes as shown in FIG. 6.

The first collection electrode 4 is a finger electrode extending from the first connection electrode 5 along the aligning direction of the solar cells 1 (see FIG. 2). The first collection electrode 4 is in contact with the diffusion layer 3 on a side opposite to a side on which the diffusion layer 3 is in contact with the single crystal silicon substrate 2 (see FIG. 5). Specifically, the first collection electrode 4 is in contact with a surface 31 of the diffusion layer 3.

The first connection electrode 5 is a bus bar electrode. In the state where each two adjacent solar cells 1 are interconnected with each other by shingling, the first connection electrode 5 is connected to the second connection electrode 9 of another solar cell 1, which is to be connected thereto (see FIG. 1). Further, the first connection electrode 5 is in contact with the diffusion layer 3 (specifically, the surface 31 of the diffusion layer 3) and the first collection electrode 4 (see FIG. 4 and FIG. 5).

Examples of a material of the first collection electrode 4 and the first connection electrode 5 include a pasty material including a binder resin and microparticles composed of silver or the like. Examples of a method for forming the first collection electrode 4 and the first connection electrode 5 include printing such as screen printing, and solidification by baking or the like.

The conductivity type (reverse conductivity type) of the diffusion layer 3 can be the n-type or the p-type as long as it is reverse of the one conductivity type, and is for example an n++ portion in which phosphorus is diffused to a concentration of about $1e18/cm^3$. The diffusion layer 3 is in contact with the first major surface 21 of the single crystal silicon substrate 2. Examples of a material of the diffusion layer 3 include silicon nitride ($SiN_x$). The diffusion layer 3 is formed by, for example, printing and baking the first collection electrode 4 and the first connection electrode 5, which include a metal such as silver, on a silicon nitride layer.

The first insulation layer 6 is layered on a portion of the surface 31 of the diffusion layer 3 in which neither the first collection electrode 4 nor the first connection electrode 5 is provided. Examples of a material of the first insulation layer 6 include silicon nitride ($SiN_x$). The first insulation layer 6 is in contact with the diffusion layer 3 on the side opposite to the side on which the diffusion layer 3 is in contact with the single crystal silicon substrate 2 (see FIG. 4). Further, the first insulation layer 6 is in contact with the diffusion layer 3 (for example, the surface 31 of the diffusion layer 3), the first collection electrode 4, and the first connection electrode 5 (see FIG. 4 and FIG. 5).

The second insulation layer 7 is in contact with the second major surface 22 of the single crystal silicon substrate 2 (see FIG. 5). Examples of a material of the second insulation layer 7 include silicon nitride ($SiN_x$). The second insulation layer 7 has at least one opening portion 70 extending therethrough. That is, the second insulation layer 7 has at least one penetrating opening portion 70. In this second insulation layer 7, a plurality of opening portions 70 are provided.

The opening portions 70 are formed by, for example, irradiating the second insulation layer 7 with laser beams. In the second insulation layer 7 of this embodiment, the opening portions 70 are provided at least in an area between the first connection electrode 5 and the second connection electrode 9, when viewed from the direction substantially perpendicular to the first major surface 21 of the single crystal silicon substrate 2. The opening portions 70 provided in this area each have, for example, a line shape extending in the direction substantially orthogonal to the aligning direction of the solar cells 1 and the thickness direction of the single crystal silicon substrate 2 (see FIG. 3). The dimension in a width direction of each opening portion 70 is, for example, about 1 mm to 3 mm. In the second insulation layer 7 of this embodiment, the opening portions 70 are provided also in areas serving as intervals 90, which will be described later, between the second connection electrodes 9.

The second collection electrode 8 is in contact with the second insulation layer 7 on a side opposite to a side on which the second insulation layer 7 is in contact with the single crystal silicon substrate 2 (see FIG. 4 and FIG. 5). The second collection electrode 8 is connected to the single crystal silicon substrate 2 via the opening portions 70 of the second insulation layer 7. The second collection electrode 8 of this embodiment is formed into a plate shape along the second major surface 22 of the single crystal silicon substrate 2. The second collection electrode 8 is brought into contact with the single crystal silicon substrate 2 to thereby form the base portions 23 in the single crystal silicon substrate 2.

The second collection electrode 8 is separated from the single crystal silicon substrate 2 via the second insulation layer 7 in almost all of the second overlapping area 112 (i.e., the overlapping area 11 on the left side in FIG. 4 and FIG. 5). The almost all of the second overlapping area 112 herein means almost all of the second overlapping area 112 not including a partial area. The second collection electrode 8 can be separated from the single crystal silicon substrate 2 via the second insulation layer 7 in all of the second overlapping area 112. In the solar cell 1 of this embodiment, the second collection electrode 8 and the single crystal silicon substrate 2 are separated from each other in a portion of the second overlapping area 112 not including an inner end portion in the aligning direction thereof, while the second collection electrode 8 and the single crystal silicon substrate 2 are in contact with each other in the inner end portion in the aligning direction of the second overlapping area 112. Even a portion of the second collection electrode 8 arranged in the second overlapping area 112 is in contact with the single crystal silicon substrate 2 particularly in the inner area in the aligning direction of the second overlapping area 112, in order to collect carriers generated when sunlight enters between the overlapping solar cells 1.

In a portion of the first overlapping area 111 of this embodiment (i.e., the overlapping area 11 located on the right side in FIG. 4 and FIG. 5), the second collection electrode 8 and the single crystal silicon substrate 2 are also in contact with each other. The second collection electrode 8 is in contact with the single crystal silicon substrate 2 in order to collect carriers generated at an end portion located on the one side in the aligning direction of the single crystal silicon substrate 2.

The second collection electrode 8 of this embodiment is arranged at least between the one end edge 24 of the single crystal silicon substrate 2 (i.e., an end edge located on the one side in the aligning direction of the solar cells 1) and the second connection electrode 9. Further, as shown in FIG. 6, a distance L1 between one end edge 81 of the second collection electrode 8 located on one side in the aligning direction of the solar cells 1 and the perpendicular surface 240 of the one end edge 24 of the single crystal silicon substrate 2 is 150% or more of a width W in the aligning direction of the inclined surface 241 of the one end edge 24 of the single crystal silicon substrate 2.

Further, a distance L2 between an other end edge 82 located on the other side in the aligning direction of the second collection electrode 8, on which side the first connection electrode 5 is arranged, and the other end edge 25 of the single crystal silicon substrate 2 is 40% or more and 90% or less of a dimension L3 of the second overlapping area 112 in the aligning direction. The distance L2 between the other end edge 82 of the second collection electrode 8 and the other end edge 25 of the single crystal silicon substrate 2 is, for example, 0.4 mm or more. The dimension L3 of the second overlapping area 112 in the aligning direction is about 1.5 mm to 2.0 mm.

Examples of a material of the second collection electrode 8 include a pasty material including a binder resin and microparticles composed of a metal such as aluminum, the microparticles capable of doping a portion of the single crystal silicon substrate 2 with positive holes by being in contact with this single crystal silicon substrate 2 to form an area with excessive positive holes (for example the base portion 23 as the p++ portion). Examples of a method for forming the second collection electrode 8 include printing such as screen printing, and solidification by baking or the like. The second collection electrode 8, if including aluminum, is discolored in portions overlapping the opening portions 70 of the second insulation layer 7 since the aluminum reacts with the single crystal silicon substrate 2 to form AlSi (aluminum silicide). Thus, the appearance of the second collection electrode 8 visually shows the positions of the opening portions 70.

The second connection electrode 9 is in contact with the second collection electrode 8 on a side opposite to a side on which the second collection electrode 8 is in contact with the second insulation layer 7. The second connection electrode 9 is separated from the single crystal silicon substrate 2 via the second insulating layer 7. The second connection electrode 9 includes second connection electrodes 9 arranged at the intervals 90 from each other in the direction substantially orthogonal to both the aligning direction of the solar cells 1 and the thickness direction of the single crystal silicon substrate 2 (see FIG. 3 and FIG. 7). The width of each interval 90 in a direction orthogonal to a direction in which the second connection electrode 9 extends is, for example, about 5 mm.

Examples of a material of the second connection electrode 9 include a pasty material including a binder resin and microparticles composed of a metal such as silver, the microparticles not forming an area with excessive positive holes (for example the base portion 23 as the p++ portion) even when they are in contact with the single crystal silicon substrate 2. Examples of a method for forming the second connection electrode 9 include printing such as screen printing, and solidification by baking or the like.

In the solar cell 1, carriers generated in the single crystal silicon substrate 2 migrate to the second connection electrode 9 via the base portions 23 and the second collection electrode 8 in the aligning direction of the solar cells 1 and in the direction substantially orthogonal to both the aligning direction and the thickness direction of the single crystal silicon substrate 2 (see FIG. 4 to FIG. 7).

Figure 8:
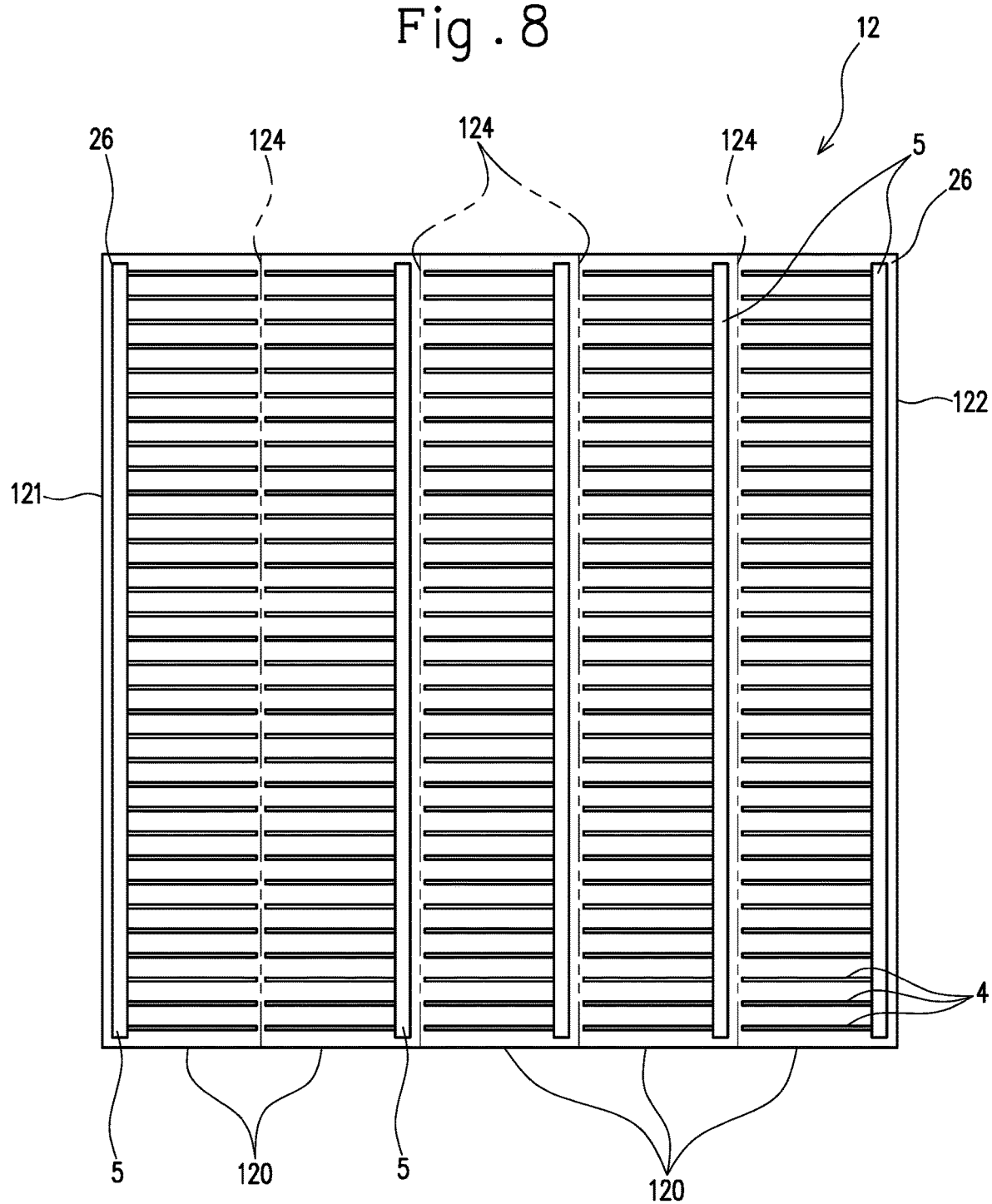
FIG. 8 is a plan view of a cell aggregate as a semi-finished product of the solar cell.
Figure 9:
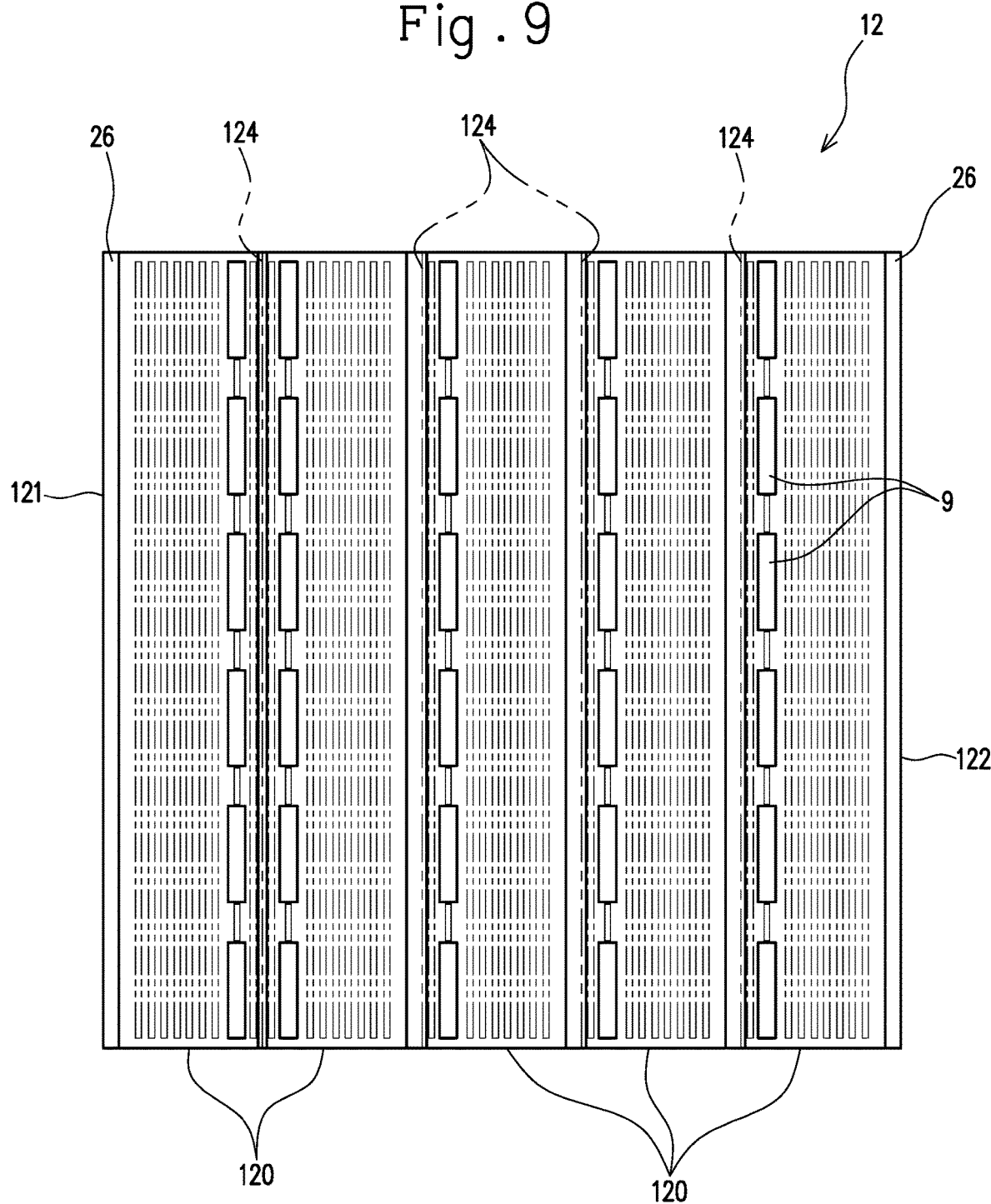
FIG. 9 is a bottom view of the cell aggregate.

The solar cell 1 configured as above is obtained by cutting a cell aggregate 12, which is a semi-finished product composed of an aggregate of portions (small segments 120) to respectively serve as the solar cells 1, into pieces with laser beams or the like at defining lines 124. The cell aggregate 12 has one side 121 and an opposed side 122 opposed to the one side 121. In the cell aggregate 12, as shown in FIG. 8 and FIG. 9, the plurality of small segments 120 are defined by the respective defining lines 124, which are straight lines substantially parallel to the one side 121 of the cell aggregate 12 (i.e., straight lines extending in a top to bottom direction in FIG. 8 and FIG. 9). The cell aggregate 12 has, for example, a square plate shape, but can be a rectangular plate shape, an octagonal shape (i.e., an octagonal shape formed from a square with its four corner portions removed), or the like. The number of small segments 120 included in the cell aggregate 12 is for example 5, but can be 6 or other numbers.

Each of the small segments 120 has a configuration corresponding to that of the solar cell 1. In the cell aggregate 12, the second collection electrode 8 is separated from the one side 121 and separated from the opposed side 122 opposed to the one side 121, when viewed from a direction substantially perpendicular to the second major surface 22.

In the small segment 120 including the one side 121 out of the plurality of small segments 120, the second connection electrode 9 is disposed along the defining line 124 located away from the one side 121. In the small segment 120 including the opposed side 122 out of the plurality of small segments 120, the second connection electrode 9 is disposed along the defining line 124 located away from the opposed side 121. Specifically, in the small segment 120 including the one side 121, the second connection electrode 9 is disposed close to and along the defining line 124 located away from the one side 121, and in the small segment 120 including the opposed side 122, the second connection electrode 9 is disposed close to and along the defining line 124 located away from the opposed line 122.

End portions 26 of the cell aggregate 12 each including the one side 121 or the opposed side 122 tend to have a lower life time than other areas. In the cell aggregate 12, the thickness of the layers may vary. For example, in the end portions 26 of the cell aggregate 12, the thickness of the first insulation layer 6 located above the single crystal silicon substrate 2 tends to have a smaller thickness than that of the other portions of the first insulation layer 6.

Figure 10A:
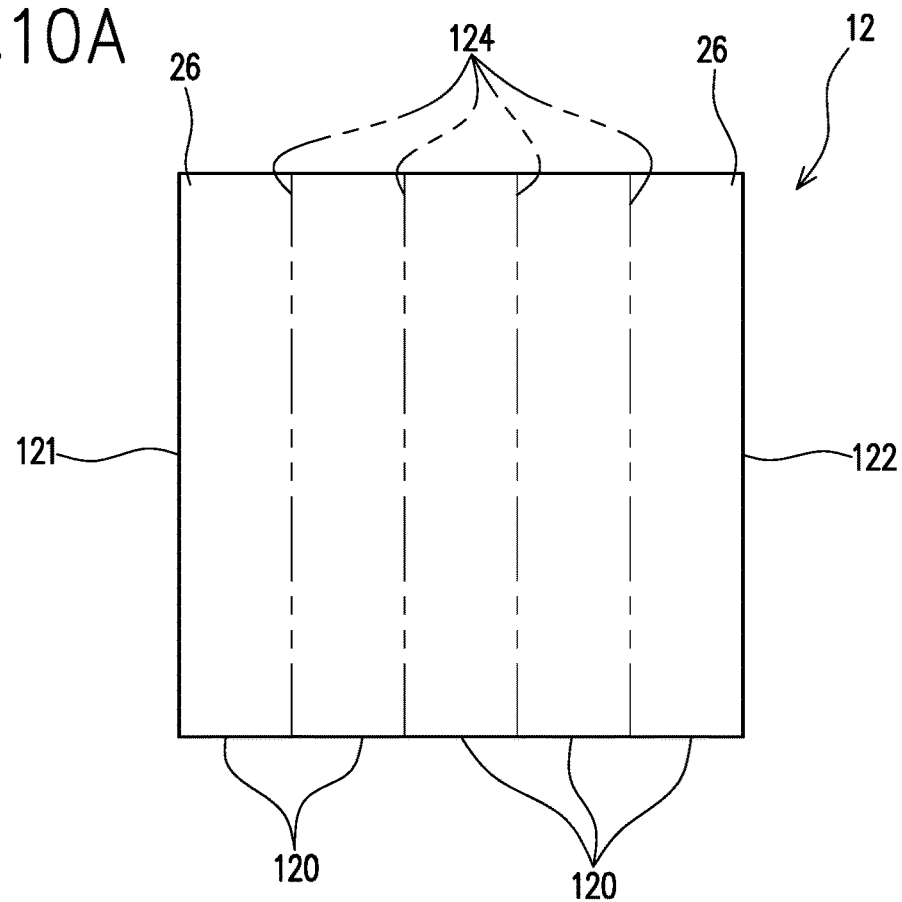
FIG. 10A is a schematic view showing a state before the cell aggregate is cut, for explaining a step of forming a solar cell string from the cell aggregate.
Figure 10B:
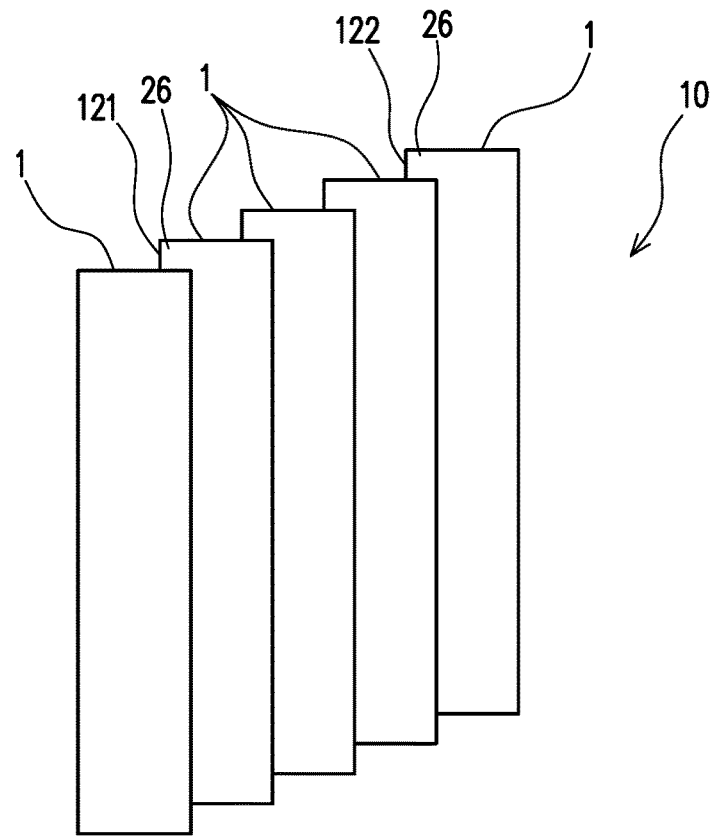
FIG. 10B is a schematic view showing the solar cell string, for explaining the step of forming the solar cell string from the cell aggregate.

The solar cell string 10 is obtained by interconnecting the solar cells 1 obtained from the cell aggregate 12 with each other by shingling. For example, the solar cell string 10 is obtained by interconnecting the solar cells 1, which have been obtained by cutting the cell aggregate 12 along the two-dot chain lines in FIG. 10A, with each other by shingling so as to have the end portions 26 hidden, as shown in FIG. 10B. In this shingling connection, the first connection electrode 5 of one of each two adjacent solar cells 1 and the second connection electrode 9 of the other one of the each two adjacent solar cells 1 are connected to each other by a metal paste 13 (see FIG. 1). The metal paste 13 is for example a silver paste, and is applied to the first connection electrode 5 and the second connection electrode 9 using a dispenser.

According to the crystal silicon solar cell module 100 configured as above, the second collection electrode 8 for collecting carriers is not arranged in almost all of the first overlapping area 111 and the almost all of the second overlapping area 112, but electricity is unlikely to be generated in the first overlapping area 111 that becomes a shaded area. Thus, the configuration that the first overlapping area 111 and the second overlapping area 112 have no second collection electrode 8 arranged causes no problem, and can even suppress the material consumption of the second collection electrode 8. Thus, the crystal silicon solar cell module 100 with an optimized structure can be provided.

The crystal silicon solar cell module 100 of this embodiment enables the second collection electrode 8 to collect carriers generated in the single crystal silicon substrate 2 avoiding a long path for migration of the carriers from the single crystal silicon substrate 2 (migration by charge conservation). This configuration can increase output by suppressing dark current and reducing resistance.

In the crystal silicon solar cell module 100 of this embodiment, the second insulation layer 7 between the second connection electrode 9 and the single crystal silicon substrate 2 allows the second connection electrode 9 and the single crystal silicon substrate 2 to be contactless with each other. This configuration suppresses recombination of minority carriers resulting from the contact of these members, and suppresses decrease of the life time. In particular, in the crystal silicon solar cell module 100 of this embodiment, it is beneficial that the second connection electrode 9 and the single crystal silicon substrate 2 are contactless with each other since the second connection electrode 9 composed of silver does not form any p++ portion such as the base portion 23.

Further, the crystal silicon solar cell module 100 of this embodiment includes the solar cells 1 each of which has the first major surface 21 of the single crystal silicon substrate 2 serving as a light receiving surface, and is thus applicable to general PERC solar cell modules.

In the crystal silicon solar cell module 100 of this embodiment, when the cell aggregate 12 is irradiated with laser beams for cutting in a step of producing the solar cells 1, the second collection electrode 8 is hardly damaged since it is located away from the portion irradiated with the laser beams on the one side in the aligning direction.

In the crystal silicon cell module 100 of this embodiment, for example the metal paste 13 is sometimes applied between the first connection electrode 5 and the second connection electrode 9 of each two adjacent solar cells 1 to be connected to each other when the solar cells 1 are interconnected with each other by shingling in the step of producing the solar cell string. In this case, even if the metal paste 13 that has been pressed between the first connection electrode 5 and the second connection electrode 9 sticks out from the portion of one solar cell 1 to which the metal paste 13 has been applied and runs into a back side of the one solar cell 1, leakage resulting from the connection between the first connection electrode 5 and the second collection electrode 8 via the metal paste 13 hardly occurs since the other end edge 82 of the second collection electrode 8 in the aligning direction of the solar cells 1 is located inward of the other end edge 25 of the single crystal silicon substrate 2 (i.e., located on the one side in the aligning direction).

Further, in the crystal silicon solar cell module 100 of this embodiment, the second connection electrodes 9 are arranged separately from each other to allow an electric current to flow through each adjacent second connection electrode 9 from the corresponding one of the opening portions 70. This configuration can reduce resistance resulting from the second connection electrode 9 and further increase output.

In the crystal silicon solar cell module 100 of this embodiment, the life time of minority carriers is low at the end portions 26 of the cell aggregate 12, but when the cell aggregate 12 is separated into the small segments 120, and the small segments 120 serving as the solar cells 1 are interconnected with each other by shingling, such shingling connection can be performed so as to allow the portion that is originally the one side 121 or the opposed side 122 of the cell aggregate 12 to be located in the overlapping area 11 in which each two adjacent solar cells 1 overlap each other. This configuration can suppress an influence on output since electricity is hardly generated in the overlapping area 11 in which the single crystal silicon substrate 2 is shaded. Moreover, since the end portions 26 of the silicon wafer in the solar cell string 10 are hidden when viewed from the direction substantially perpendicular to the first major surface 21, the crystal silicon solar cell module 100 having an excellent design can be obtained even when, for example, the first insulation layer 6 layered on the end portions 26 of the cell aggregate 12 has a smaller thickness than that of the other portions of the first insulation layer 6.

In the crystal silicon solar cell module 100 of this embodiment, the second collection electrode 8 and the single crystal silicon substrate 2 are in contact with each other in a portion of the second overlapping area 112, for example, in the inner end portion in the aligning direction of the second overlapping area 112. This configuration allows the second collection electrode 8 to collect carriers generated in an area close to the second overlapping area 112 (i.e., an area of the single crystal silicon substrate 2 close to the second overlapping area 112), and can thus increase output.

It is a matter of course that the crystal silicon solar cell module of the present invention is not limited to the aforementioned embodiment, but various modifications can be made without departing from the gist of the present invention. For example, a configuration of an embodiment can be added to a configuration of another embodiment, and part of a configuration of an embodiment can be replaced by a configuration of another embodiment. Further, part of a configuration of an embodiment can be deleted.

For example, the crystal silicon solar cell module 100 of the aforementioned embodiment has been described by taking, for example, the case where the second collection electrode 8 and the single crystal silicon substrate 2 are in contact with each other in a portion of the first overlapping area 111 or a portion of the second overlapping area 112, but the second collection electrode 8 and the single crystal silicon substrate 2 can be separated from each other via the first insulation layer 6 or the second insulation layer 7 in at least one of the entire first overlapping area 111 and the entire second overlapping area 112.

The materials and shapes of the layers forming the solar cell 1 are not limited to those in the aforementioned embodiment. For example, the second connection electrode 9 of the aforementioned embodiment includes the second connection electrodes 9 extending at the intervals 90 from each other in the direction orthogonal to both the aligning direction of the solar cells 1 and the thickness direction of the single crystal silicon substrate 2, but can extend without intervals.

Further, the solar cell 1 can be of a double-surface light reception type, in which case light enters from the second major surface 22 side of the single crystal silicon substrate 2 on which a second collection electrode formed of a plurality of lines or having a grid shape is disposed. Further, in this case, the first major surface 21 of the single crystal silicon substrate 2 serves as one light receiving surface while the second major surface 22 thereof serves as the other light receiving surface.

As described above, according to the present invention, a crystal silicon solar cell module including a plurality of PERC solar cells interconnected with each other by shingling, the crystal silicon solar cell module with an optimized structure can be obtained.

A crystal silicon solar cell module of the present invention includes: a solar cell string including a plurality of PERC solar cells, each two adjacent ones of the plurality of PERC solar cells being interconnected with each other by shingling; each of the plurality of PERC solar cells including: a single crystal silicon substrate of one conductivity type having a first major surface and a second major surface; a diffusion layer of reverse conductivity type that is in contact with the first major surface; a first collection electrode that is in contact with the diffusion layer on a side opposite to a side on which the diffusion layer is in contact with the single crystal silicon substrate; a first connection electrode that is in contact with the diffusion layer and the first collection electrode; an insulation layer that is in contact with the second major surface and has at least one opening portion extending therethrough; a second collection electrode that is in contact with the insulation layer on a side opposite to a side on which the insulation layer is in contact with the single crystal silicon substrate, and that is connected to the single crystal silicon substrate via the at least one opening portion; and a second connection electrode that is in contact with the second collection electrode on a side opposite to a side on which the second collection electrode is in contact with the insulation layer, in which the first connection electrode and the second connection electrode are separated from each other when viewed from a direction substantially perpendicular to the first major surface in the each of the plurality of PERC solar cells, the solar cell string has an overlapping area in which the each two adjacent solar cells overlap each other, in the overlapping area of the each two adjacent solar cells, the first connection electrode of one of the each two adjacent solar cells and the second connection electrode of the other of the each two adjacent solar cells are connected with each other while overlapping each other when viewed from the direction substantially perpendicular to the first major surface, and the second collection electrode and the single crystal silicon substrate are separated from each other via the insulation layer in almost all of the overlapping area excluding a part thereof or all of the overlapping area.

Such a configuration causes no problem even when the second collection electrode for collecting carriers is not arranged in almost all of the overlapping area that becomes a shaded area and is thus unlikely to generate electricity. Accordingly, the unnecessity of arranging the second collection electrode can suppress the material consumption of the second collection electrode. This configuration can provide a crystal silicon solar cell module with an optimized structure.

In the crystal silicon solar cell module, the configuration can be such that the second collection electrode of each of the plurality of solar cells is arranged at least between the second connection electrode and an end edge of the single crystal silicon substrate located on one side, on which side the second connection electrode is arranged in an aligning direction of the plurality of solar cells in the solar cell string.

Such a configuration enables the second collection electrode to collect carriers avoiding a long migration path from the single crystal silicon substrate, and can thus increase output by suppressing dark current and reducing resistance.

In the crystal silicon solar cell module, the configuration can be such that the second connection electrode and the single crystal silicon substrate are separated from each other via the insulation layer.

Such a configuration allows the second connection electrode and the single crystal silicon substrate to be contactless with each other, and thus suppresses recombination of minority carriers resulting from the contact of these members, and suppresses decrease of the life time.

In the crystal silicon solar cell module, the configuration can be such that the first major surface serves as a light receiving surface.

Such a configuration enables the crystal silicon solar cell module to apply to general PERC solar cell modules.

In the crystal silicon solar cell module, the configuration can be such that, in each of the plurality of solar cells, an end edge of the single crystal silicon substrate located on one side, on which side the second connection electrode is arranged in the aligning direction of the solar cells in the solar cell string, has a surface substantially perpendicular to the first major surface, and an inclined surface formed by laser irradiation when the each of the plurality of solar cells is formed, and a distance between an end edge on the one side of the second collection electrode and the surface of the single crystal silicon substrate substantially perpendicular to the first major surface is 150% or more of a width in the aligning direction of the inclined surface.

According to such a configuration, when a semi-finished product (cell aggregate) of the solar cell is irradiated with laser beams for cutting in the step of producing the solar cells, the second collection electrode is hardly damaged since it is located away from the portion irradiated with the laser beams.

In the crystal silicon solar cell module, the configuration can be such that, in each of the plurality of solar cells, a distance between an end edge of the second collection electrode located on an other side, on which side the first connection electrode is arranged in an aligning direction of the plurality of solar cells in the solar cell string, and an end edge on the other side of the single crystal silicon substrate is 40% or more and 90% or less of a dimension in the aligning direction of the overlapping area.

In the crystal silicon solar cell module, the configuration can be such that, in each of the plurality of solar cells, a distance between an end edge of the second collection electrode located on an other side, on which side the first connection electrode is arranged in the aligning direction of the plurality of solar cells in the solar cell string, and an end edge on the other side of the single crystal silicon substrate is 0.4 mm or more.

According to such a configuration, for example a metal paste is sometimes applied between the first connection electrode and the second connection electrode of each two adjacent solar cells to be connected to each other when the solar cells are interconnected with each other by shingling in the step of producing the solar cells. In this case, even if the metal paste runs into a back side of the portion of one solar cell to which the metal paste has been applied, leakage resulting from the connection between the first connection electrode and the second collection electrode via the metal paste hardly occurs since the end edge on the other side in the aligning direction of the second collection electrode is located inward of the end edge on the other side of the single crystal silicon substrate (i.e., located on the one side in the aligning direction).

In the crystal silicon solar cell module, the configuration can be such that the second connection electrode includes second connection electrodes arranged at an interval from each other in a direction substantially orthogonal to both an aligning direction of the plurality of solar cells in the solar cell string and a thickness direction of the single crystal silicon substrate, and the insulation layer has an opening portion arranged in an area serving as the interval between the second connection electrodes.

Such a configuration in which the second connection electrodes are separately arranged from each other allows an electric current to flow through each adjacent second connection electrode from the corresponding one of the opening portions, and can thus decrease resistance and further increase output.

A cell aggregate for a crystal silicon solar cell module of the present invention is composed of an aggregate of a plurality of small segments respectively forming a plurality of PERC solar cells when the aggregate is separated into pieces, the cell aggregate having one side and an opposed side to the one side, the plurality of small segments respectively defined by defining lines that are straight lines substantially parallel to the one side of the cell aggregate, in which each of the plurality of small segments includes: a single crystal silicon substrate of one conductivity type having a first major surface and a second major surface; a diffusion layer of reverse conductivity type that is in contact with the first major surface; a first collection electrode that is in contact with the diffusion layer on a side opposite to a side on which the diffusion layer is in contact with the single crystal silicon substrate; a first connection electrode that is in contact with the diffusion layer and the first collection electrode; an insulation layer that is in contact with the second major surface and has at least one opening portion extending therethrough; a second collection electrode that is in contact with the insulation layer on a side opposite to a side on which the insulation layer is in contact with the single crystal silicon substrate, and that is connected to the single crystal silicon substrate via the at least one opening portion; and a second connection electrode that is in contact with the second collection electrode on a side opposite to a side on which the second collection electrode is in contact with the insulation layer, the first connection electrode and the second connection electrode are separated from each other when viewed from a direction substantially perpendicular to the first major surface in the each of the plurality of small segments, the second collection electrode is separated from the one side of the cell aggregate and separated from the opposed side to the one side of the cell aggregate, when viewed from a direction substantially perpendicular to the second major surface, in a small segment including the one side of the cell aggregate among the plurality of small segments, the second connection electrode is provided along the defining line away from the one side of the cell aggregate, and in a small segment including the other side of the cell aggregate among the plurality of small segments, the second connection electrode is provided along the defining line away from the opposed side of the cell aggregate.

According to such a configuration, the life time of minority carriers is low at the end portion of the cell aggregate, but when the cell aggregate is separated into the small segments, and the small segments serving as the solar cells are interconnected with each other by shingling, such shingling connection can be performed so as to allow the portion that is originally the one side or the opposed side of the cell aggregate to be located in the overlapping area in which each two adjacent solar cells overlap each other. This configuration can suppress an influence on output since electricity is hardly generated in the overlapping area that becomes a shaded area.

REFERENCE SIGNS LIST

1: Solar cell
2: Single crystal silicon substrate
3: Diffusion layer
4: First collection electrode
5: First connection electrode 6: First insulation layer
7: Second insulation layer (insulation layer)
8: Second collection electrode
9: Second connection electrode
10: Solar cell string
11: Overlapping area
12: Cell aggregate
13: Metal paste
21: First major surface
22: Second major surface
23: Base portion
24: One end edge
25: Other end edge
26: End portion
31: Surface
70: Opening portion
81: One end edge
82: Other end edge
90: Interval
100 Crystal silicon solar cell module
111: First overlapping area
112: Second overlapping area
120: Small segment
121: One side
122: Opposed side
124: Defining line
240: Perpendicular surface (cleavage surface)
241: Inclined surface
L1, L2: Distance
L3: Dimension
W: Width

The invention claimed is:

1. A crystal silicon solar cell module, comprising:
a solar cell string comprising a plurality of PERC solar cells, each two adjacent ones of the plurality of PERC solar cells being interconnected with each other by shingling;
each of the plurality of PERC solar cells comprising:
a single crystal silicon substrate of one conductivity type having a first major surface and a second major surface;
a diffusion layer of reverse conductivity type that is in contact with the first major surface;
a first collection electrode that is in contact with the diffusion layer on a side opposite to a side on which the diffusion layer is in contact with the single crystal silicon substrate;
a first connection electrode that is in contact with the diffusion layer and the first collection electrode;
an insulation layer that is in contact with the second major surface and has at least one opening portion extending therethrough;
a second collection electrode that is in contact with the insulation layer on a side opposite to a side on which the insulation layer is in contact with the single crystal silicon substrate, and that is connected to the single crystal silicon substrate via the at least one opening portion; and
a second connection electrode that is in contact with the second collection electrode on a side opposite to a side on which the second collection electrode is in contact with the insulation layer, wherein
the first connection electrode and the second connection electrode are separated from each other when viewed from a direction substantially perpendicular to the first major surface in the each of the plurality of PERC solar cells,
the solar cell string has an overlapping area in which the each two adjacent PERC solar cells overlap each other,
in the overlapping area of the each two adjacent PERC solar cells, the first connection electrode of one of the each two adjacent PERC solar cells and the second connection electrode of the other of the each two adjacent PERC solar cells are connected with each other while overlapping each other when viewed from the direction substantially perpendicular to the first major surface,
in each of the plurality of PERC solar cells,
the second collection electrode and the single crystal silicon substrate are separated from each other via the insulation layer in all of the overlapping area or almost all of the overlapping area excluding a part thereof,
an end edge of the single crystal silicon substrate located on one side, on which side the second connection electrode is arranged in an aligning direction of the PERC solar cells in the solar cell string, has a surface substantially perpendicular to the first major surface, and an inclined surface formed by laser irradiation when the each of the plurality of PERC solar cells is formed, and
a distance between an end edge on the one side of the second collection electrode and the surface of the single crystal silicon substrate substantially perpendicular to the first major surface is 150% or more of a width in the aligning direction of the inclined surface.

2. The crystal silicon solar cell module according to claim 1, wherein
in each of the plurality of PERC solar cells,
a distance between an end edge of the second collection electrode located on an other side, on which side the first connection electrode is arranged in the aligning direction of the plurality of PERC solar cells in the solar cell string, and an end edge on the other side of the single crystal silicon substrate is 0.4 mm or more.

3. A crystal silicon solar cell module according to claim 1, comprising:
a solar cell string comprising a plurality of PERC solar cells, each two adjacent ones of the plurality of PERC solar cells being interconnected with each other by shingling;
each of the plurality of PERC solar cells comprising:
a single crystal silicon substrate of one conductivity type having a first major surface and a second major surface;
a diffusion layer of reverse conductivity type that is in contact with the first major surface;
a first collection electrode that is in contact with the diffusion layer on a side opposite to a side on which the diffusion layer is in contact with the single crystal silicon substrate;
a first connection electrode that is in contact with the diffusion layer and the first collection electrode;
an insulation layer that is in contact with the second major surface and has at least one opening portion extending therethrough;
a second collection electrode that is in contact with the insulation layer on a side opposite to a side on which the insulation layer is in contact with the single crystal silicon substrate, and that is connected to the single crystal silicon substrate via the at least one opening portion; and
a second connection electrode that is in contact with the second collection electrode on a side opposite to a side on which the second collection electrode is in contact with the insulation layer, wherein the first connection electrode and the second connection electrode are separated from each other when viewed from a direction substantially perpendicular to the first major surface in the each of the plurality of PERC solar cells, the solar cell string has an overlapping area in which the each two adjacent PERC solar cells overlap each other, in the overlapping area of the each two adjacent PERC solar cells, the first connection electrode of one of the each two adjacent PERC solar cells and the second connection electrode of the other of the each two adjacent PERC solar cells are connected with each other while overlapping each other when viewed from the direction substantially perpendicular to the first major surface, in each of the plurality of PERC solar cells, the second collection electrode and the single crystal silicon substrate are separated from each other via the insulation layer in all of the overlapping area or almost all of the overlapping area excluding a part thereof, the second collection electrode has one end edge located on one side in an aligning direction of the plurality of PERC solar cells, and another end edge located on another side in the aligning direction, on which side the first connection electrode is arranged, a distance between the other end edge and an end edge on the other side of the single crystal silicon substrate is 40% or more and 90% or less of a dimension in the aligning direction of the overlapping area.

4. The crystal silicon solar cell module according to claim 3, wherein in each of the plurality of PERC solar cells, a distance between an end edge of the second collection electrode located on another side, on which side the first connection electrode is arranged in the aligning direction of the plurality of PERC solar cells in the solar cell string, and an end edge on the other side of the single crystal silicon substrate is 0.4 mm or more.

5. A cell aggregate for a crystal silicon solar cell module, the cell aggregate composed of an aggregate of a plurality of small segments respectively forming a plurality of PERC solar cells when the aggregate is separated into pieces, the cell aggregate having one side and an opposed side to the one side, the plurality of small segments respectively defined by defining lines that are straight lines substantially parallel to the one side of the cell aggregate, wherein each of the plurality of small segments comprises:

a single crystal silicon substrate of one conductivity type having a first major surface and a second major surface;

a diffusion layer of reverse conductivity type that is in contact with the first major surface;

a first collection electrode that is in contact with the diffusion layer on a side opposite to a side on which the diffusion layer is in contact with the single crystal silicon substrate;

a first connection electrode that is in contact with the diffusion layer and the first collection electrode;

an insulation layer that is in contact with the second major surface and has at least one opening portion extending therethrough;

a second collection electrode that is in contact with the insulation layer on a side opposite to a side on which the insulation layer is in contact with the single crystal silicon substrate, and that is connected to the single crystal silicon substrate via the at least one opening portion; and a second connection electrode that is in contact with the second collection electrode on a side opposite to a side on which the second collection electrode is in contact with the insulation layer, the first connection electrode and the second connection electrode are separated from each other when viewed from a direction substantially perpendicular to the first major surface in the each of the plurality of small segments, the second collection electrode is separated from the one side of the cell aggregate and separated from the opposed side to the one side of the cell aggregate, when viewed from a direction substantially perpendicular to the second major surface, in a small segment including the one side of the cell aggregate among the plurality of small segments, the second connection electrode is provided along the defining line away from the one side of the cell aggregate, and in a small segment including the other side of the cell aggregate among the plurality of small segments, the second connection electrode is provided along the defining line away from the opposed side of the cell aggregate.

* * * * *